United States Patent
Neill et al.

(10) Patent No.: US 12,127,484 B2
(45) Date of Patent: Oct. 22, 2024

(54) TUNABLE QUBIT COUPLER

(71) Applicant: Google LLC, Mountain View, CA (US)

(72) Inventors: Charles Neill, Goleta, CA (US);
Anthony Edward Megrant, Goleta, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/971,292

(22) Filed: Oct. 21, 2022

(65) Prior Publication Data

US 2023/0043001 A1    Feb. 9, 2023

Related U.S. Application Data

(63) Continuation of application No. 16/959,101, filed as application No. PCT/US2019/039908 on Jun. 28, 2019, now Pat. No. 11,482,656.

(51) Int. Cl.
| | | |
|---|---|---|
| H10N 60/80 | (2023.01) | |
| G06N 10/00 | (2022.01) | |
| H10N 60/12 | (2023.01) | |

(52) U.S. Cl.
CPC ........... H10N 60/805 (2023.02); G06N 10/00 (2019.01); H10N 60/12 (2023.02)

(58) Field of Classification Search
CPC ...... H10N 60/805; H10N 60/12; G06N 10/00; G06N 10/40; B82Y 10/00
See application file for complete search history.

(56) References Cited

U.S. PATENT DOCUMENTS

| | | |
|---|---|---|
| 9,971,970 B1 | 5/2018 | Rigetti et al. |
| 10,121,754 B2 | 11/2018 | Oliver et al. |
| 10,134,972 B2 | 11/2018 | Oliver et al. |
| 10,199,553 B1 | 2/2019 | Oliver et al. |
| 10,235,635 B1 | 3/2019 | Abdo |
| 10,242,968 B2 | 3/2019 | Das et al. |
| 10,352,992 B1 | 7/2019 | Zeng et al. |
| 10,381,541 B2 | 8/2019 | Das et al. |
| 10,396,269 B2 | 8/2019 | Oliver et al. |
| 10,586,909 B2 | 3/2020 | Das et al. |
| 10,658,424 B2 | 5/2020 | Oliver et al. |
| 11,482,656 B2 * | 10/2022 | Neill ............... G06N 10/40 |

(Continued)

FOREIGN PATENT DOCUMENTS

| | | |
|---|---|---|
| CN | 107580752 | 1/2018 |
| CN | 108475353 | 8/2018 |

OTHER PUBLICATIONS

Bialczak et al., "Demonstration of a Tuneable Coupler for Superconducting Qubits Using Coherent, Time Domain, Two-Qubit Operations," https://arxiv.org/abs/1007.2219, Jul. 2010, 23 pages.

(Continued)

*Primary Examiner* — Jung Kim
(74) *Attorney, Agent, or Firm* — Fish & Richardson P.C.

(57) ABSTRACT

Methods, systems and apparatus for implementing a tunable qubit coupler. In one aspect, a device includes: a first data qubit, a second data qubit, and a third qubit that is a tunable qubit coupler arranged to couple to the first data qubit and to couple to the second data qubit such that, during operation of the device, the tunable qubit coupler allows tunable coupling between the first data qubit and the second data qubit.

12 Claims, 8 Drawing Sheets

(56) References Cited

U.S. PATENT DOCUMENTS

2017/0193388 A1 7/2017 Filipp et al.
2018/0013052 A1 1/2018 Oliver et al.

OTHER PUBLICATIONS

Geller et al., "Tunable coupler for superconducting Xmon qubits: Perturbative nonlinear model," https://arxiv.org/abs/1405.1915, May 2014, 10 pages.
Harris et al., "Sign- and magnitude-tunable coupler for superconducting flux qubits," https://arxiv.org/abs/cond-mat/0608253v4, last revised Jul. 2007, 5 pages.
Krinner et al., "Engineering cryogenic setups for 100-qubit scale superconducting circuit systems," https://arxiv.org/abs/1806.07862, Jun. 2018, 31 pages.
Li et al., "Perfect Quantum State Transfer in a Superconducting Qubit Chain with Parametrically Tunable Couplings," Phys. Rev. Applied, Nov. 2018, 10(054009):10 pages.
Office Action in Canadian Appln. No. 3,090,429, dated Aug. 20, 2021, 5 pages.
Office Action in Canadian Appln. No. 3,090,429, dated Jul. 25, 2022, 5 pages.
Office Action in European Appln. 19740297.7, dated Jul. 28, 2022, 15 pages.
PCT International Search Report and Written Opinion in International Appln. No. PCT/US2019/039908, mailed Mar. 12, 2020, 17 pages.
Yan et al., "A tunable coupling scheme for implementing high-fidelity two-qubit gates," https://arxiv.org/abs/1803.09813, Mar. 2018, 10 pages.
Notice of Allowance in Canadian Appln. No. 3,090,429, dated May 31, 2023, 1 page.
Notice of Allowance in European Appln. No. 19740297.7, dated Jun. 6, 2023, 8 pages.
Office Action in Chinese Appln. No. 201980010469.4, mailed on Apr. 22, 2024, 21 pages (with English translation).

\* cited by examiner

TUNABLE QUBIT COUPLER

This application is a continuation of U.S. patent application Ser. No. 16/959,101, now U.S. Pat. No. 11,482,656, filed on Jun. 29, 2020, which is a National Stage Application under 35 U.S.C. § 371 and claims the benefit of International Application No. PCT/US2019/039908, filed Jun. 28, 2019. The disclosure of the foregoing application is hereby incorporated by reference in its entirety.

TECHNICAL FIELD

The present disclosure relates to tunable qubit couplers.

BACKGROUND

Large-scale quantum computers have the potential to provide fast solutions to certain classes of difficult problems. Multiple challenges in the design and implementation of quantum architecture to control, program and maintain quantum hardware impede the realization of large-scale quantum computing.

SUMMARY

The present disclosure describes technologies for implementing a tunable qubit coupler. In general, an innovative aspect of the subject matter of the present disclosure may be embodied in devices that include: a first data qubit; a second data qubit; and a third qubit, in which the third qubit is a tunable qubit coupler arranged to couple to the first data qubit and to couple to the second data qubit such that, during operation of the device, the tunable qubit coupler allows tunable coupling between the first data qubit and the second data qubit.

Implementations can include any, all, or none of the following features. For example, in some implementations, the device of claim 1, includes a first substrate, in which the first data qubit and the second data qubit are on a principal surface of the first substrate; and a second substrate spaced apart from and coupled to the first substrate, in which the tunable qubit coupler is on a principal surface of the second substrate and is arranged so as to overlap a portion of the first data qubit and a portion of the second data qubit. The tunable qubit coupler may be arranged on a first axis, wherein the first axis is: orthogonal to a second axis that connects the first data qubit and the second data qubit; and intersects the second axis between the first data qubit and the second data qubit. A space between the first substrate and the second substrate is under a vacuum pressure of less than at most $10^{-5}$ Torr. Each of the first data qubit and the second data qubit may include a corresponding elongated arm, and the elongated arm of the first data qubit may be spaced apart from the elongated arm of the second data qubit by a gap. The tunable qubit coupler may include an elongated wire, in which the elongated wire overlaps the elongated arm of the first data qubit, the elongated arm of the second data qubit, and the gap.

In some implementations, the tunable qubit coupler includes a superconducting quantum interference device (SQUID) directly connected to the elongated wire. Each of the first data qubit and the second data qubit may include a corresponding differential qubit. The tunable qubit coupler may include a transmon qubit. The principal surface of the first substrate may face the principal surface of the second substrate. The first data qubit and the second data qubit may be arranged on the principal surface of the first substrate such that, during operation of the device, the first data qubit and the second data qubit are directly coupled.

In some innovative aspects, methods of controlling coupling between a first data qubit and a second data qubit using a third qubit that is a tunable qubit coupler, in which the tunable qubit coupler is arranged to couple to the first data qubit and to couple to the second data qubit, include: controlling coupling between the first data qubit and the second data qubit by varying an operating frequency of the tunable qubit coupler.

Implementations of the methods may include one or more or none of the following features. For example, in some implementations, the tunable qubit coupler includes a superconducting quantum interference device (SQUID), and varying the operating frequency of the tunable qubit coupler includes varying a magnetic flux of the SQUID of the tunable qubit coupler. Varying the operating frequency of the tunable qubit coupler may include varying the operating frequency within a range of no less than about 4 GHz and no more than about 6 GHz.

The method may include: tuning each of the first data qubit and the second data qubit to a same resonance frequency; and subsequently varying the operating frequency of the tunable qubit coupler to turn coupling on between the first data qubit and the second data qubit.

The resonance frequency of the first data qubit and the second data qubit may be within a range of about 4 GHz to about 8 GHz. The resonance frequency of the first data qubit and the second data qubit may differ from the operating frequency of the tunable qubit coupler by about 0.5 GHz to 7 GHz.

In some implementations, the method may include, before tuning each of the first data qubit and the second data qubit to the same resonance frequency, varying the operating frequency of the tunable qubit coupler to a first frequency to turn coupling off between the first data qubit and the second data qubit. Varying the operating frequency of the tunable qubit coupler to turn coupling off may include varying the operating frequency so that a direct coupling between the first data qubit and the second data qubit is offset by an indirect coupling between the first data qubit and the second data qubit through the tunable qubit coupler. A coupling between the first data qubit and the second data qubit that is a combination of the direct coupling and the indirect coupling may operate over a frequency range of about 45 MHz. The indirect coupling between the first data qubit and the second data qubit through the tunable qubit coupler may occur across a vacuum space under a vacuum pressure of less than at least 10-5 Torr.

The first data qubit and the second data qubit may be arranged on a first substrate, and the tunable qubit coupler is arranged on a second substrate that is spaced apart from the first substrate.

The subject matter described in this specification can be implemented in particular ways so as to realize one or more of the following advantages.

For example, in some implementations, the tunable qubit coupler described in this specification allows for fast tunable coupling of qubits. In some implementations, the coupling can be achieved without significantly reducing qubit quality or performance. In some implementations, the coupling provides a dynamic control range for a two-qubit gate applied to the coupled qubits and zero coupling of the qubits during an OFF state. Quantum computing hardware implementing the tunable coupler described in this specification can therefore achieve, in certain implementations, improved levels of performance, e.g., improved algorithm execution speed and reduced loss, and perform quantum computations with increased accuracy and reliability. Additionally, in some implementations, the ability to turn off the interaction between qubits also provides reduced frequency crowding since qubits can be configured to operate at the same frequency and even sweep past each other without interaction. Additionally, in some implementations, multi-qubit state transitions can be suppressed by turning off the coupling during readout.

Details of one or more implementations of the subject matter of this specification are set forth in the accompanying drawings and the description below. Other features, aspects, and advantages of the subject matter will become apparent from the description, the drawings, and the claims.

DETAILED DESCRIPTION

Overview

Figure 1:
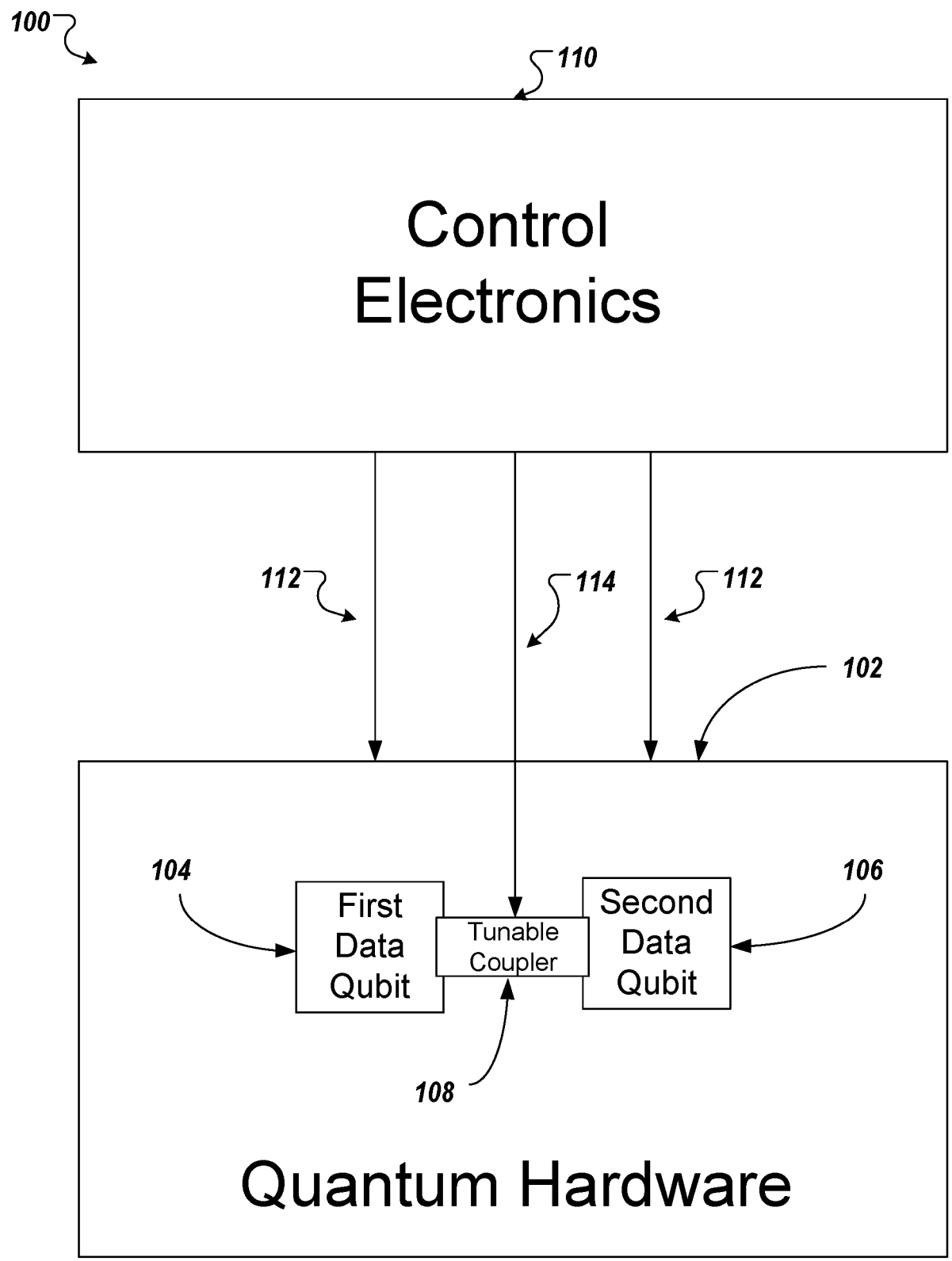
FIG. 1 depicts an exemplary system that serves as an operating environment for two data qubits coupled by a tunable qubit coupler.

Controlling interactions between qubits is important for being able to perform quantum simulations and universal quantum computations. For example, in order to perform algorithms on a quantum computer, it may be necessary to apply one or more two-qubit gates. Two-qubit gates may be implemented by having two qubits interact. In some implementations, the interaction between the qubits can be dynamically controlled using a tunable qubit coupler.

When using superconducting qubits, for example transmon qubits, coupling between a first and second qubit can be realized by positioning an edge of the first qubit close to an edge of the second qubit. However, such a design only allows for dynamic control of the coupling between the qubits by detuning the resonance frequency of at least one of the two qubits. This requires a high degree of control because detuning often leads to excitations of the qubits into states outside the computational subspace. Further, the OFF state in such a design may not correspond to zero coupling given that a sufficiently large detuning is not feasible and therefore has constant loss associated with it. To provide for tunable coupling between qubits that does not have the aforementioned problems, a component may be introduced between the qubits which allows the coupling strength between the qubits to be modulated. Introducing an additional component in order to achieve tunable qubit coupling and an OFF state with zero coupling raises various technical problems that have to be solved. For example, the additional tunable qubit coupler element should not reduce the qubits' quality (factor) or performance below some acceptable predetermined threshold, e.g., it should not significantly decrease the relaxation or coherence time $T_1$. One source for a reduction of the quality (factor) or an increase in loss may be, for example, the tunable qubit coupler's interaction with the qubits in that the coupler also has a finite quality factor and relaxation or coherence time. Another source for loss may be the introduction of new materials into the hardware in the proximity of the qubits itself. The preservation of the established quality of the qubits while implementing a tunable qubit coupler poses various design challenges both on the conceptual level as well as on the level of actual physical implementation. The present disclosure overcomes those technical challenges.

The device encompassed by the present disclosure includes three elements, two qubits referred to as data qubits and a tunable qubit coupler that includes a tunable non-linear oscillator. The tunable non-linear oscillator may be realized by adding a large capacitor to a DC-SQUID and realizing a specific ratio of junction critical current and capacitance. The tunable qubit coupler realized in this way is similar to a transmon qubit where the specific ratio of junction critical current and capacitance is in the transmon regime. The tunable qubit coupler is not used as a carrier of quantum information and is therefore technically not a transmon qubit, but for convenience may still be referred to as a (single-ended) transmon qubit herein. The two data qubits may be transmon qubits, though other qubits can be used instead. Adding a large shunt capacitance to realize the tunable qubit coupler mitigates charge noise and allows for capacitive coupling of the two data qubits.

The data qubits and the coupler are configured and arranged such that, during operation of the data qubits, the coupler allows for fast tunable coupling of the data qubits without significantly reducing the data qubits' quality or performance, while providing a dynamic control range for a two-qubit gate realized by the interacting data qubits and zero coupling of the data qubits during an OFF state.

This is achieved by satisfying one or more design principles, namely the possibility for large detuning between the data qubits and coupler, arranging the coupler in a parallel plate geometry relative to the data qubits to achieve strong coupling, providing a vacuum gap between those plates to ensure low loss, and providing direct coupling between the data qubits in addition to the indirect coupling between the data qubits via the coupler in order to achieve zero sum coupling between the data qubits for an OFF state.

Those design principles are satisfied using example implementations of the present disclosure. The two data qubits can be realized by two transmon qubits that are arranged on some suitable substrate where the transmon qubits may be single ended or may have a differential design. A direct coupling between the data qubits can be realized by locating the transmon qubits such that the edges of the respective qubits facing one another, e.g., respective superconductor arms, are parallel to each other and separated by a gap. Herein, the respective superconductor arms are also referred to as elongated arms or coupling arms. An additional transmon qubit, e.g., a single-ended transmon qubit, that implements the coupler, is located on a second substrate. The two substrates are arranged such that the side of the substrate on which the data qubits are located face the side of the substrate on which the coupler is located. The coupler is positioned such that its area covers the coupling arms of the data qubits as well as the gap between those arms, and a gap, e.g., a vacuum gap, between data qubits and coupler is established. The two substrates may be aligned using bump-bonding. The coupler couples to both data qubits. By varying the coupler's frequency, the coupling between the data qubits can be tuned.

This design satisfies the design principles described above, that is the design allows for fast tunable coupling of the data qubits using a tunable coupler while preserving the data qubits' performance and provides a dynamic control range for a two-qubit gate realized by the interacting data qubits as well as an OFF state with zero coupling.

Example Operating Environment

FIG. 1 depicts an exemplary system that serves as an operating environment for the devices described with reference to FIGS. 2 and 4.

The system 100 includes quantum hardware 102 that includes at least a first data qubit 104, a second data qubit 106, and a tunable qubit coupler 108 between the first data qubit and the second data qubit. The first data qubit 104, the second data qubit 106, and the tunable qubit coupler 108 may be subcomponents of the quantum hardware 102. For example, quantum hardware 102 may include additional data qubits and additional tunable qubit couplers. Each of the first data qubit 104, the second data qubit 106, and the tunable qubit coupler 108 may be frequency-tunable.

The first data qubit 104 and the second data qubit 106 may be superconducting qubits. For example, the first data qubit 104 and the second data qubit 106 may be transmon qubits. Further, the transmon qubits may have a differential design or may be single-ended. As an example, for a transmon qubit formed of a DC SQUID having two sides, each defined by a Josephson junction, the two sides can be left electrically open, which may be referred to as a differential design, or one side may be shunted to a ground plane, which may be referred to as a single-ended design. Other qubit architectures may be used instead. The tunable qubit coupler 108 will be explained in more detail with reference to FIGS. 2-3 below.

The system 100 includes control electronics 110. Control electronics 110 may include an arbitrary waveform generator, filters, attenuators, and mixers, among other circuit elements. For readout, the control electronics 110 may also include amplifiers and analog to digital converters, among other circuit elements.

The system 100 includes control lines 112 from the control electronics 110 to the quantum hardware 102. The control lines 112 enable direct or indirect control of the first data qubit 104, second data qubit 106 and the tunable coupler 108. In some cases the control lines 112 may include qubit control lines that allow for direct control of the first data qubit 104 and the second data qubit 106. The frequency of the first data qubit 104 and the second data qubit 106 may be tuned using signals provided over control lines 112. The frequency of the first data qubit 104 and the second data qubit 106 may be tuned by applying a control signal to the control lines 112 via control electronics 110. In addition, control electronics 110 can perform measurements of the first data qubit 104 and the second data qubit 106 through control lines 112. Measurement of the first data qubit 104 and measurement of the second data qubit 106 determines the state of the first data qubit 104 and the second data qubit 106, respectively. Control electronics 110 can store, display, and/or further process the results of each of the measurements of the first data qubit 104 and the second data qubit 106.

The system 100 includes tunable qubit coupler control line 114. Control electronics 110 can dynamically tune the coupling or interaction between the first data qubit 104 and the second data qubit 106 by applying a control signal over the tunable qubit coupler control line 114 to tune the tunable qubit coupler 108 frequency. For example, control electronics 110 may apply a voltage pulse to the tunable qubit coupler control line 114 to tune the tunable qubit coupler 108 frequency. Tuning the coupling or interaction between the first data qubit 104 and the second data qubit 106 by applying a control signal to the tunable qubit coupler control line 114 to tune the tunable qubit coupler 108 frequency by using the example devices shown in FIGS. 2-3 will be explained in more detail with reference to FIGS. 4-6.

In some implementations, the control electronics 110 may include a data processing apparatus and associated memory. The memory may include a computer program having instructions that, when executed by the data processing apparatus, cause the data processing apparatus to perform one or more functions described herein, such as applying a control signal to a qubit and/or to a tunable qubit coupler.

Example Tunable Qubit Coupler

Figure 2A:
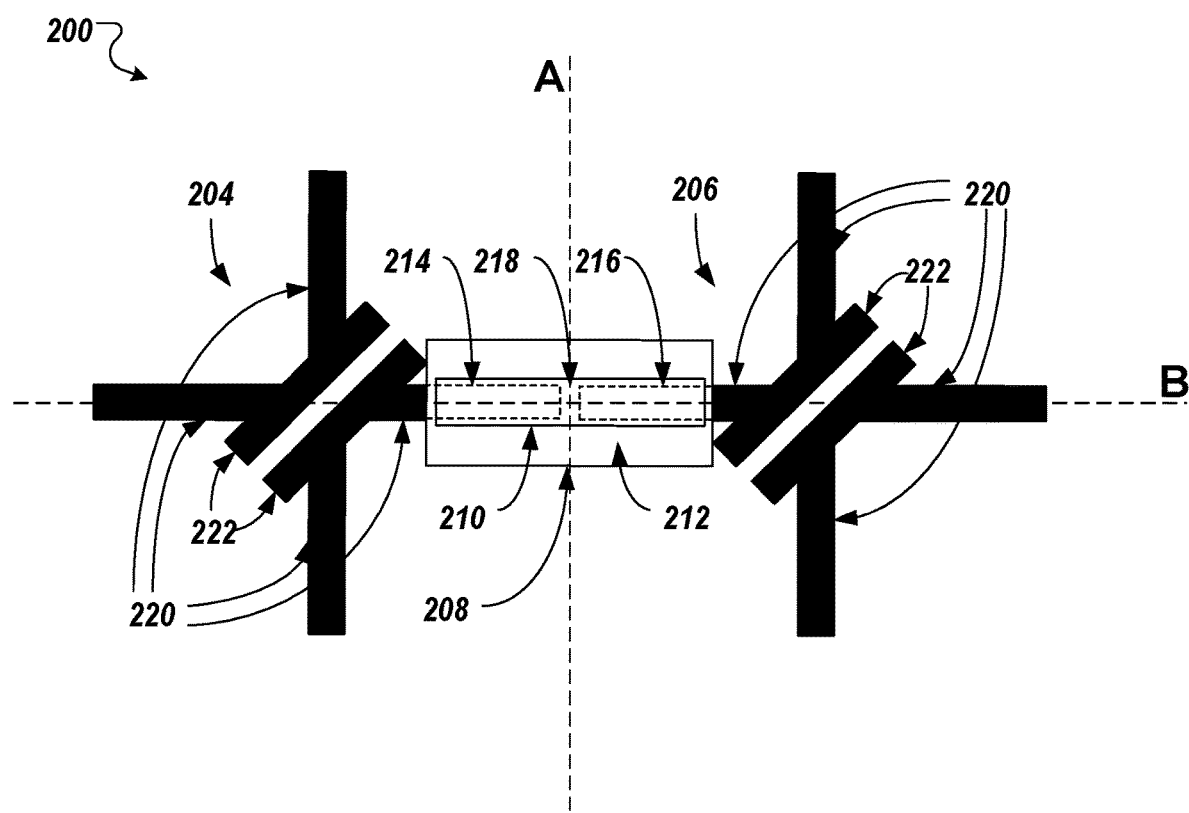
FIG. 2A is a schematic of an example design for a first data qubit and a second data qubit coupled by a tunable qubit coupler.

FIG. 2A is a schematic 200 of an example design for a first data qubit 204 and a second data qubit 206 coupled by a tunable qubit coupler 208.

In the example design the first data qubit 204 and the second data qubit 206 are transmon qubits that have a differential design. Each qubit 204, 206 includes four elongated arms 220 of superconducting material and two diagonal strips 222 of superconducting material that are arranged parallel to each other and are separated by a gap. Other qubit architectures and designs are possible. In particular, in some implementations, one or both of the first data qubit 204 and the second data qubit 206 may be single-ended transmon qubits. In either case, however, the tunable qubit coupler is single-ended to provide the indirect coupling, which allows the direct and indirect couplings to cancel and overall coupling between the data qubits to be turned off.

The first data qubit 204 and the second data qubit 206 are arranged such that one of each qubit's elongated arms extends towards each other. For example, as shown in FIG. 2A, elongated arm 214 of first data qubit 204 extends towards elongated arm 216 of the second data qubit 206. The elongated arms that extend towards each other are spaced apart by a gap. For example, elongated arm 214 of the first data qubit 204 and elongated arm 216 of the second data qubit are separated by distance 218. This arrangement provides a direct coupling between the first data qubit 204 and the second data qubit 206 through capacitive coupling. The first data qubit 204 and the second data qubit 206 may be on a surface of a first substrate. For example, the first data qubit 204 and the second data qubit 206 may be arranged on a principal surface of a first substrate such that during operation the qubits may couple both directly and indirectly via the tunable qubit coupler 208.

The tunable qubit coupler 208 is arranged on a second substrate that is positioned over the first substrate on which the data qubits 204, 206 are positioned. The second substrate is separated from the first substrate by gap, but may also be coupled to the first substrate through, e.g., a bump bond. A first axis, e.g. axis A, that is orthogonal to a second axis, e.g. axis B. The second axis B extends through the first data qubit 204 and the second data qubit 206, that is both the first data qubit 204 and 206 are positioned on the second axis. The first axis A intersects the second axis B between the first data qubit 204 and the second data qubit 206. The tunable coupler 208 may be on a surface of a second substrate that faces the surface on which the first data qubit 204 and the second data qubit 206 are arranged.

The tunable qubit coupler 208 includes a superconductor island 210, e.g. a single superconductor island such as an elongated wire, that faces the first data qubit 204 and the second data qubit 206 and that overlaps the elongated arm 214 of the first data qubit 204, the elongated arm 216 of the second data qubit 206, and the separation distance 218. The superconductor island 210 may at least partially surrounded by a ground plane 212 on the second substrate. In some cases the superconductor island 210 and the ground plane 212 may be made of different materials. In other cases the superconductor island 210 and the ground plane 212 may be made of the same material. For instance, the superconductor island 210 may be of a superconducting metal, such as aluminum. The ground plane 212 may also be made of aluminum or a different superconductor material. Further, superconductor island 210 may be coupled to the ground plane 212 through a SQUID (not shown in FIG. 2A) where the SQUID may be located between the island 210 and a control line (not shown). More details on how the first data qubit 204, the second data qubit 206 and the tunable qubit coupler 208 are positioned on a first and a second substrate respectively and connected to control lines will be described in more detail below with reference to FIGS. 4A-4B.

The amount overlap of the island 210 with the elongated arms 214, 216 correlates with the coupling strength of the indirect coupling between the first data qubit and the second data qubit through the tunable qubit coupler 208 where increasing the overlap increases the coupling. A stronger coupling allows for a larger detuning of the tunable qubit coupler 208 from the first data qubit 204 and the second data qubit 206, which in turn reduces additional loss due to presence of the tunable qubit coupler 208. The overlap can be designed to achieve certain design parameters, as described with respect to FIG. 3.

Figure 2B:
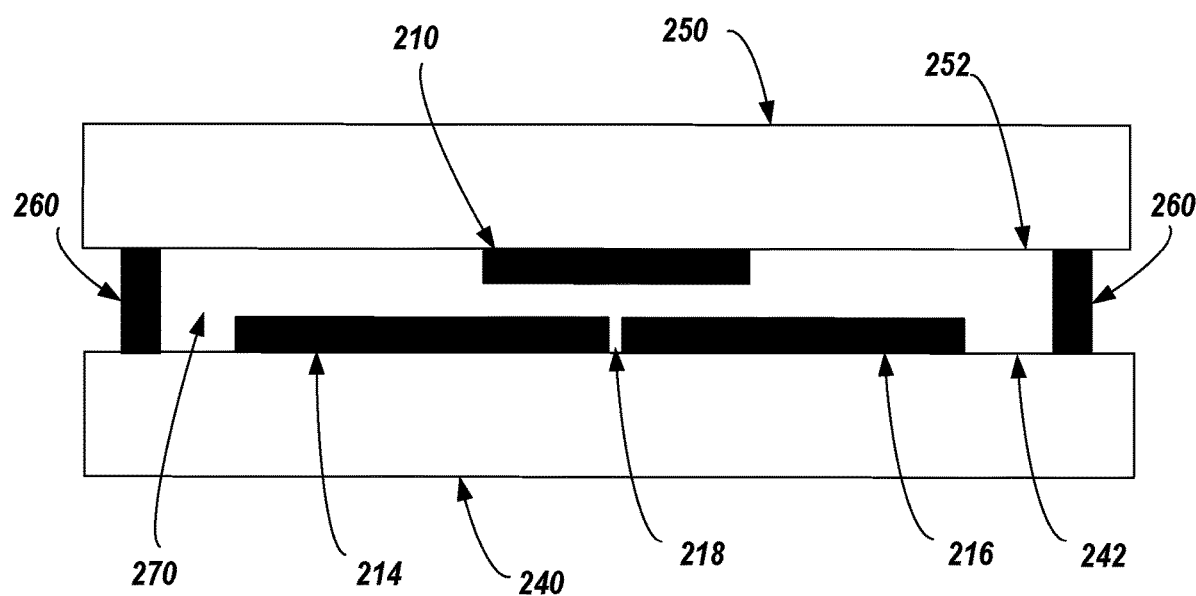
FIG. 2B is a schematic of an example design for a first data qubit and a second data qubit coupled by a tunable qubit coupler.

FIG. 2B is a schematic that illustrates a cross-section view through line B of FIG. 2A. Both the first data qubit 204 and the second data qubit 206 are positioned on a principal surface 242 of a first substrate 240. For ease of viewing, only the elongated arm 214 of the first data qubit 204 and the elongated arm 216 of the second data qubit 206 are shown in FIG. 2B. The elongated arm 214 is separated from the elongated arm 216 by the distance 218. During operation of the qubit system, direct coupling between the first data qubit 204 and the second data qubit 206 may occur through the elongated arms 214, 216. For alternative qubit designs, direct coupling between the qubits may occur through other edges or surfaces of the qubits.

The tunable qubit coupler 210 is formed on a principal surface 252 of a second substrate 250. The second substrate 250 may be positioned over the first substrate 240, such that the principal surface 252 faces the principal surface 242. As shown in FIG. 2B, the tunable qubit coupler 210 overlaps with both the elongated arm 214 and the elongated arm 216. The second substrate 250 may be bonded, e.g., bump bonded, to the first substrate 240 using bonds 260 (e.g., bump bonds). A gap 270 separates the first substrate 240 from the second substrate 250. The space within the gap 270 may be a low pressure environment, e.g., a vacuum. Each of the first substrate 240 and second substrate 250 may be formed of a dielectric, such as silicon or sapphire.

In the example of FIGS. 2A and 2B the tunable qubit coupler 208 is designed as a tunable non-linear oscillator with a large capacitor added to a DC-SQUID and a specific ratio of junction critical current of the SQUID and capacitance in the transmon regime. Adding a large shunt capacitance mitigates charge noise of the tunable qubit coupler 208 and allows for capacitive coupling to the first data qubit 204 and the second data qubit 206. This design for the tunable qubit coupler 208 is equivalent to the design of a single-ended transmon qubit. The tunable qubit coupler 208 may therefore also be referred to as a qubit, e.g., a transmon qubit, although it is not used to carry or encode quantum information. Other designs are possible. For example, a ratio of junction critical current of the SQUID and capacitance not in the transmon regime may be chosen. In particular, a different ratio may be chosen when designs other than the differential design are chosen for the first data qubit 204 and the second data qubit 206.

Example Design Parameters and Corresponding Results

Figure 3:
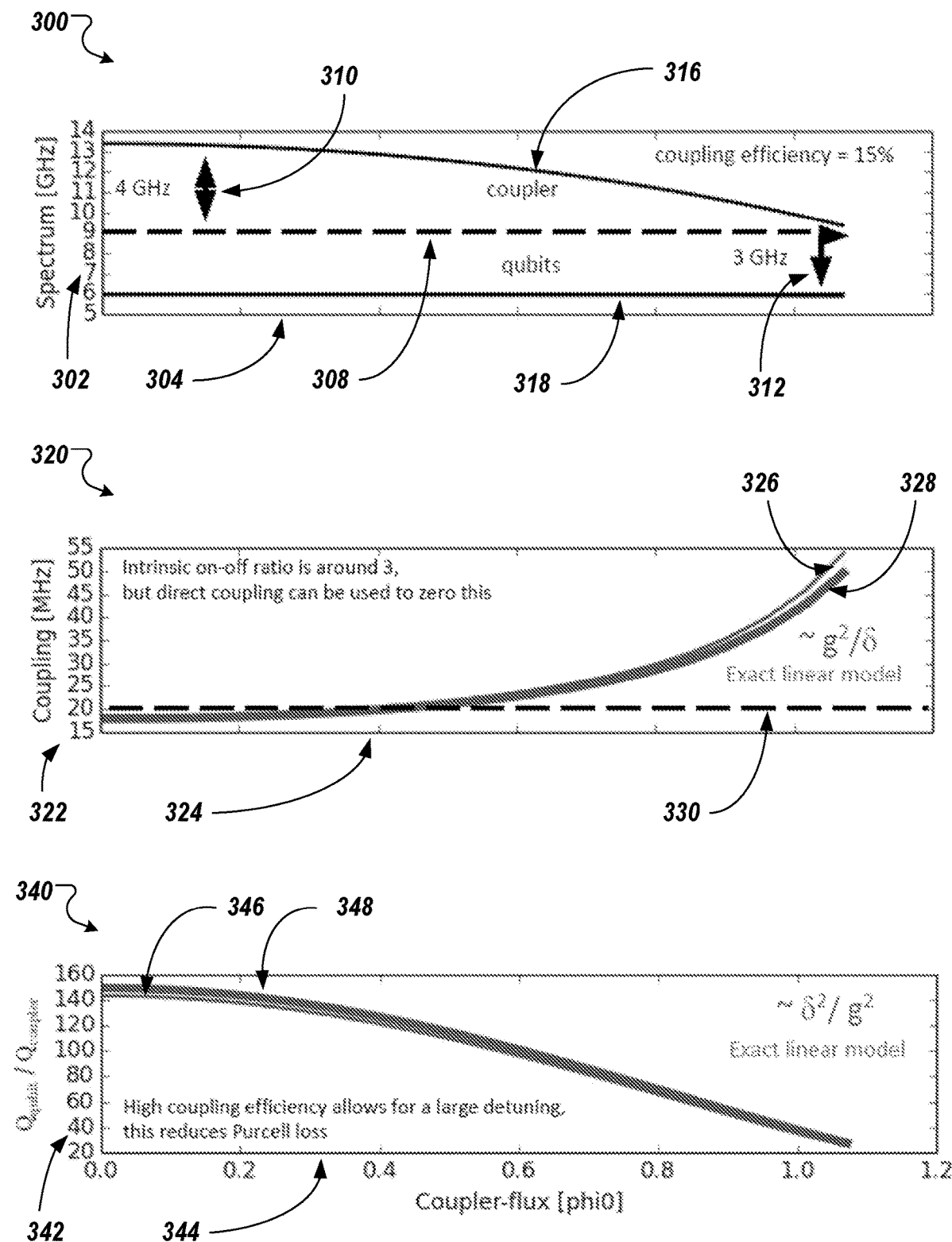
FIG. 3 shows simulation results for design principles for a tunable qubit coupler.

FIG. 3 shows simulation results 300, 320, and 340 for design principles for a tunable qubit coupler. The simulation results 300, 320, and 340 may correspond to a first data qubit 204, a second data qubit 206, and a tunable qubit coupler 208 as described with reference to FIG. 2.

One example design principle for a tunable qubit coupler, e.g. tunable qubit coupler 208 of FIG. 2, is that the tunable qubit coupler should not significantly affect the coherence or relaxation times of a first data qubit and a second data qubit to which the tunable qubit coupler couples. To avoid these adverse affects, the tunable qubit coupler may be detuned from the first data qubit and the second data qubit, that is, the tunable qubit coupler operates far away in frequency from the first data qubit and the second data qubit. In some implementations, it is preferable to provide relatively strong coupling from the tunable qubit coupler to each of the first and second data qubit, given that coupling of the first data qubit and the second data qubit through the tunable qubit coupler is an indirect coupling, which is a second order process. Adding a tunable qubit coupler may introduce loss in various ways and reduce the quality (factor) of the qubits. The simulation results of FIG. 3 show that implementing the presently described tunable qubit coupler such as coupler 208 of FIGS. 2A and 2B achieves dynamic control of the coupling between the qubits with large detuning of the coupler and the qubits, strong coupling of the qubits through the coupler, and no significant reduction of the qubits' quality. In addition, when the first data qubit and the second data qubit are arranged to also allow direct coupling between them such as for example in FIG. 2A, the direct coupling strength can be chosen such that it is cancelled out by a specific value of the indirect coupling and a total coupling with zero coupling strength is achieved that may serve as an OFF state.

The physical realization of the tunable qubit coupler as part of the quantum hardware may lead to loss or a reduction of the qubits' quality that are not covered by these considerations, e.g., the introduction of additional materials into the proximity of the qubits may significantly influence them. An example design of a quantum computing chip that includes a tunable qubit coupler in accordance with the present disclosure, e.g. tunable qubit coupler 208 of FIG. 2A, and that does not significantly reduce the qubits' quality is described with reference to FIGS. 4 and 5. In particular, in the aforementioned design the qubits are positioned on a first substrate and tunable qubit coupler is positioned on a second substrate together with other control elements, a parallel plate geometry is used and the qubits and the coupler are separated by a vacuum gap.

The three plots 300, 320 and 340 of FIG. 3 include horizontal axes 304, 324, and 344, respectively. Each horizontal axis 304, 324 and 344 represents coupler flux $\phi_0$ applied to the tunable qubit coupler and has a same scale.

Plot 300 includes a vertical axis 302 representing a frequency spectrum in GHz. Solid straight line 318 represents the frequency of the first data qubit and the second data qubit. In this example, the frequency of the first data qubit and the second data qubit is approximately 6 GHz. Solid line 316 represents the coupler frequency. For a coupler flux of zero the coupler is at a frequency of approximately 13 GHz and detuned from the first data qubit and the second data qubit by approximately 7 GHz. Increasing the coupler flux decreases the coupler frequency. Dashed line 308 represents a lower bound for the coupler frequency of approximately 9 GHz, i.e., approximately 3 GHz detuned from the first data qubit and the second data qubit as indicated by arrow 312. The coupler frequency is dynamically tunable through the coupler flux over a range of 4 GHz as indicated by arrows 310. The coupling efficiency is approximately 15%.

Plot 320 includes a vertical axis 322 representing a coupling in MHz between the first data qubit and the second data qubit through the coupler. Line 326 represents the coupling based on an approximation of the physical system including the tunable qubit coupler and the first data qubit and the second data qubit where the approximation has a characteristic dependency that can be expressed as $g^2/\delta$ where g represents the coupling between the tunable qubit coupler and the data qubits, also understood as the interaction strength in a corresponding Jaynes Cummings Hamiltonian, and $\delta$ is the frequency difference between the tunable qubit coupler and the data qubits, also understood as the detuning between the tunable qubit coupler and the first data qubit and the second data qubit. The approximate expression $g^2/\delta$ is the lowest order correction in $g/\delta$ to the data qubit frequency Line 328 represents the indirect coupling based on an exact linear model of the physical system including the tunable qubit coupler and the first data qubit and the second data qubit. Lines 326 and 328 substantially coincide over the coupling range. Dashed straight line 330 represents an offset value for the indirect coupling through the tunable qubit coupler that facilitates a second order interaction between the first data qubit and the second data qubit. By designing the direct coupling between the first data qubit and the second data qubit to have the same value as the offset value, the total coupling as a combination of the direct coupling between the first data qubit and the second data qubit and the indirect coupling between the first data qubit and the second data qubit through the tunable qubit coupler can be made zero for a specific coupler flux value (e.g., where the line 330 crosses with the indirect coupling frequency). A total coupling of zero provides an OFF state with no coupling between the first data qubit and the second data qubit. Further, the plot 320 shows small coupling when the coupler is detuned the farthest away from the first data qubit and the second data qubit and monotonically increasing coupling for decreasing detuning. The coupler frequency relates to the coupling strength approximately such that a time it would take to perform a two-qubit operation or two-qubit gate, e.g., to entangle two qubits, is inversely proportional to the coupling strength. For example, for a 20 MHz coupling it takes on the order of 50 nanoseconds to entangle two qubits. Increasing the coupling strength reduces the time for implementing two-qubit gates, that is an increased coupling strength provides faster two-qubit gates which in turn also reduces two-qubit gate errors.

Plot 340 includes a vertical axis 342 representing a quality factor of a qubit, e.g. the first data qubit or the second data qubit, modified by the tunable qubit coupler divided by the quality factor of the tunable qubit coupler. The data presented in plot 340 relates to the loss incurred by the qubit from the tunable qubit coupler and the ratio represented by the vertical axis 342 may be understood as how well the qubit is protected from the loss that may be induced by the tunable qubit coupler. Line 346 represents qubit loss induced by the coupler based on an approximation of the physical system including the tunable qubit coupler and the first data qubit and the second data qubit where the approximation has a characteristic dependency that can be expressed as $\delta^2/g^2$ where g represents the interaction strength in a corresponding Jaynes Cummings Hamiltonian and $\delta$ the detuning between the tunable qubit coupler and the first data qubit and the second data qubit. Line 348 represents the coupling based on an exact linear model of the physical system including the tunable qubit coupler and the first data qubit and the second data qubit. Lines 346 and 348 substantially coincide over the coupling range. When the qubit and the tunable qubit coupler are detuned from each other the most, i.e. by approximately 7 GHz, the loss imparted on the qubit by the coupler is approximately 140 times smaller than the intrinsic loss of the coupler. When reducing the distance in frequency between the qubit and the coupler (and increasing the coupling between the qubit and the coupler), the loss imparted on the qubit by the coupler is at least approximately 20 times smaller than the intrinsic loss of the coupler.

Implementing a tunable qubit coupler for a first data qubit and a second data qubit as described in the present disclosure provides a controllable dynamic range of the coupling (including strong coupling) between the first data qubit and the second data qubit, fast two-qubit gate times, zero total coupling for a specific indirect coupling strength through the coupler and an appropriate choice of direct coupling between the first data qubit and the second data qubit, without significantly reducing the quality factor of the first data qubit and the second data qubit.

Example Quantum Computing Chip Design

Figure 4A:
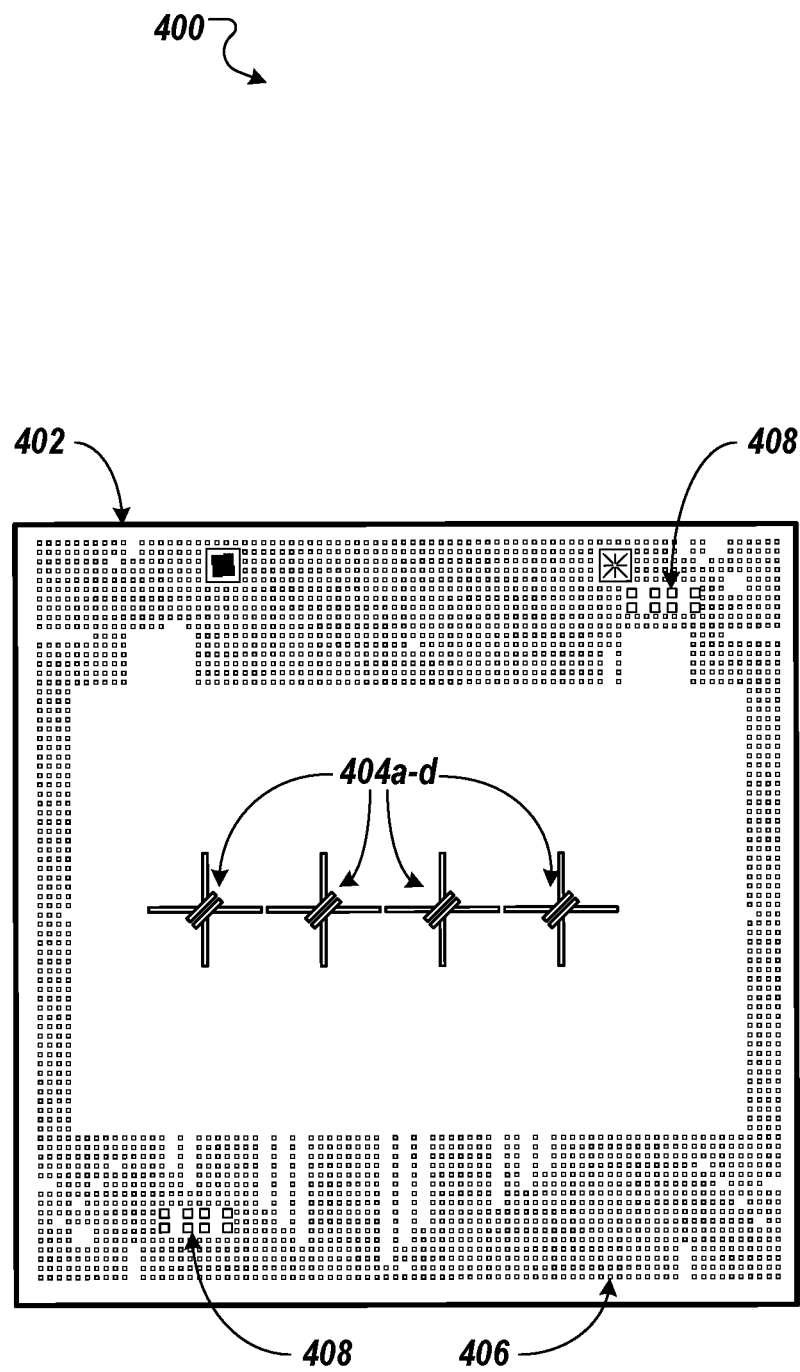
FIGS. 4A and 4B are schematics that illustrate an example of a quantum computing chip design that includes four data qubits and three tunable qubit couplers.
Figure 4B:
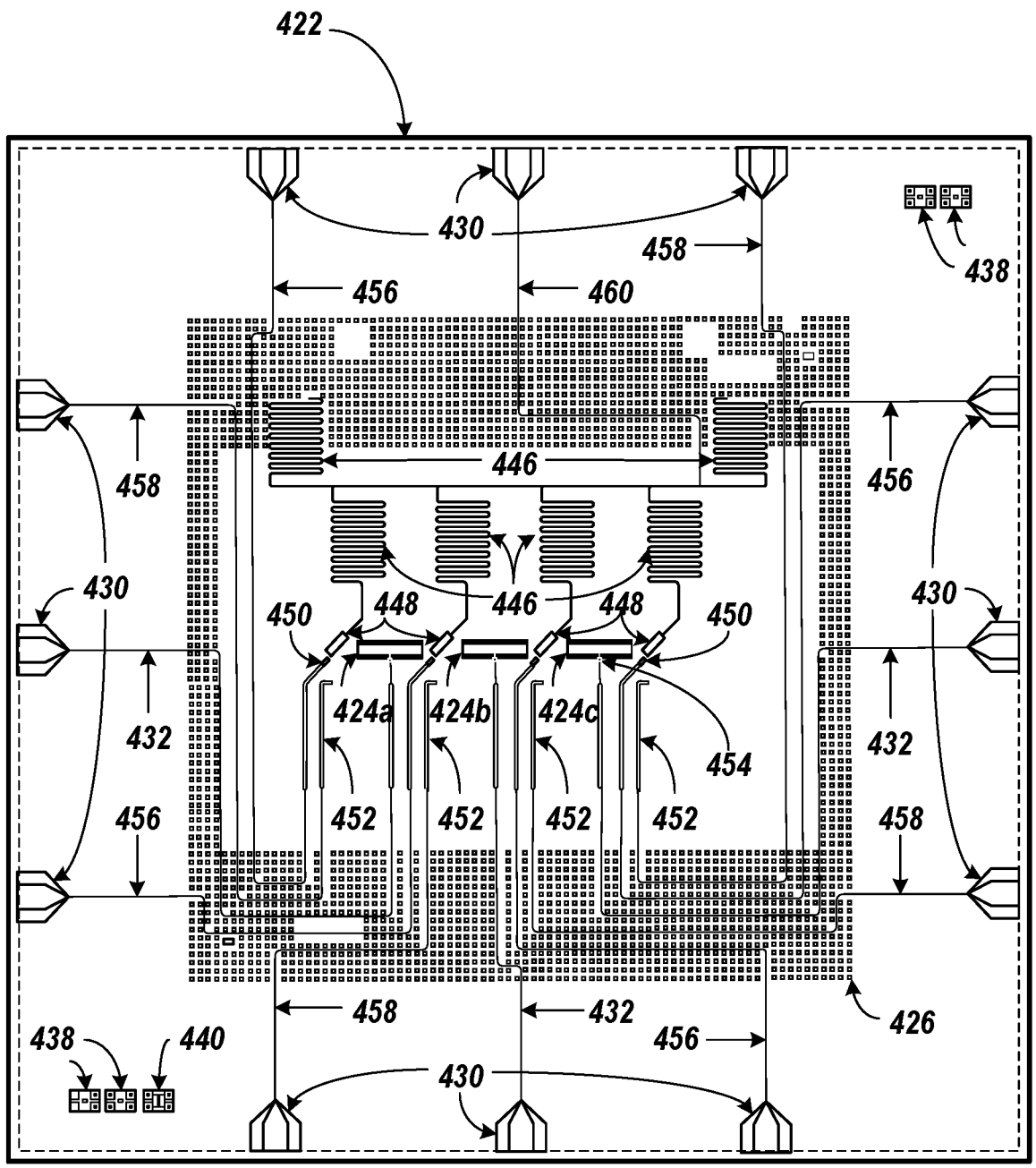

FIGS. 4A and 4B are schematics that illustrate an example of a quantum computing chip design 400 that includes four data qubits and three tunable qubit couplers. The quantum computing chip design 400 realizes the design principles as explained in more detail with reference to FIG. 3. The quantum computing chip design achieves tunable coupling of adjacent pairs of the four qubits through the three tunable qubit couplers and provides a dynamic and controllable range of coupling strengths between adjacent qubits, fast two-qubit gate execution, and an OFF state with zero coupling between adjacent qubits without reducing an intrinsic performance of the qubits and the coupler.

Quantum computing chip 400 includes a first substrate 402 and a second substrate 422. FIG. 4A is a schematic that illustrates an example of a first substrate that includes the data qubits, whereas FIG. 4B is a schematic that illustrates an example of a second substrate that includes the tunable qubit couplers, and that is bonded to the first substrate. For convenience the two substrates 402, 422 are shown separately. The first substrate 402 includes a principal surface. Elements described with reference to the first substrate 402, e.g., qubits 404a-d, are positioned on the principal surface of the first substrate 402. In FIG. 4A, the principal surface of the first substrate 402 supports the elements 404-412. The second substrate 422 includes a principal surface. Elements described with reference to the second substrate 422, e.g., couplers 424a-c, are positioned on the principal surface of the second substrate 422, as shown in FIG. 4B.

In an assembled state, the second substrate 422 is layered on top of the first substrate 402 with the principal surfaces facing each other. The second substrate 422 is positioned on top of the first substrate 402 such that respective tunable couplers 424a-c overlap portions of the two qubits that they couple. The two substrates are bonded together through bonding elements 406 and 426, respectively. For example, the bonding elements 406 and 426 may be bump bonds. Bonding elements 406 and 426 may be made of indium. When the two substrates are bonded together the first substrate and the second substrate are separated by a gap and, further, elements described with reference to the first substrate 402, e.g., qubits 404a-d, except bonding elements 406 are separated by a gap from elements described with reference to the second substrate 422, e.g., couplers 424a-c, except bonding elements 426. A space between the first substrate and the second substrate may be under a vacuum pressure of less than at most $10^{-5}$ Torr.

The first substrate 402 includes four qubits 404a-d. The qubits 404a-d may correspond to the first data qubit 204 and the second data qubit 206 described with reference to FIG. 2. For example, qubits 404a and 404b may correspond to one instance of qubits 204 and 206, respectively. Qubits 404b and 404c may correspond to a second instance of qubits 204 and 206, respectively. Qubits 404c and 404d may correspond to a third instance of qubits 204 and 206, respectively. As in the example of FIG. 2, qubits 404a-d in the example quantum computing chip design 400 are transmon qubits with a differential design. However, other qubit architectures and designs may be used. In particular, single-ended transmon qubits may be used instead.

The first substrate 402 further includes electric test structures 408 for measuring the room-temperature resistance of the DC SQUIDS The second substrate 422 includes three tunable qubit couplers 424a-c. The tunable qubit couplers 424a-c may be the tunable qubit coupler 208 described with reference to FIG. 2. When assembled the first substrate 402 and the second substrate 422 are positioned such that the qubits 404a-d and tunable couplers 424a-c are arranged according to the arrangement of the first data qubit 204, the second data qubit 206, and the tunable qubit coupler 208 of FIG. 2. That is tunable qubit coupler 424a couples qubits 404a and 404b, tunable qubit coupler 424b couples qubits 404b and 404c, and tunable qubit coupler 424c couples qubits 404c and 404d according to the arrangement described with reference to FIG. 2.

Each of the tunable qubit coupler 424a-c includes a SQUID, e.g. SQUID 454, that is directly electrically connected to the superconductor island where the island may be an elongated wire. Each of the SQUIDs, e.g. SQUID 454, is located between a corresponding superconductor island of each of the tunable qubits couplers 424a-c and a tunable qubit coupler control line 432.

The second substrate 422 includes qubit control lines 456, 458 that each have an electrically open or floating end 450, 452, respectively, for coupling to the qubits. Qubit control lines may allow for frequency control of a corresponding qubit on the first substrate when the two substrates are bonded together.

The second substrate 422 includes measurement lines 460 that each are galvanically coupled to a half-wave resonance filter 446 with open boundaries. The readout resonators 446 are capacitively coupled to the qubits at ends 448.

The second substrate 422 further includes bonding pads 430 to connect the on chip wire to an external control line using a wire bond, test structures 438 for measuring the room-temperature resistance of the DC SQUIDS, test structures 440 for measuring the contact resistance of electric cross-overs, capacitive coupling elements 448 between readout resonators and qubits, and measurement input/output lines 460.

The design of the quantum computing chip 400 in an assembled state may be referred to herein as having a parallel plate geometry. The design of the tunable qubit coupler together with the qubits that are coupled through the coupler that is described with reference to FIG. 2 fulfils the design principles of providing strong coupling, a dynamic and controllable coupling range, large detuning from the qubits, an OFF state with zero coupling on a conceptual level, and preservation of the qubits' quality and performance. The parallel plate geometry with the tunable qubit coupler on a different substrate than the qubits and the two substrates separated by a vacuum gap solves the problem of physical implementation of the tunable qubit coupler fulfilling the key design principles, strong (capacitive) coupling in particular, without introducing significant additional qubit errors or loss.

Example Quantum Computing Chip Results

Figure 5:
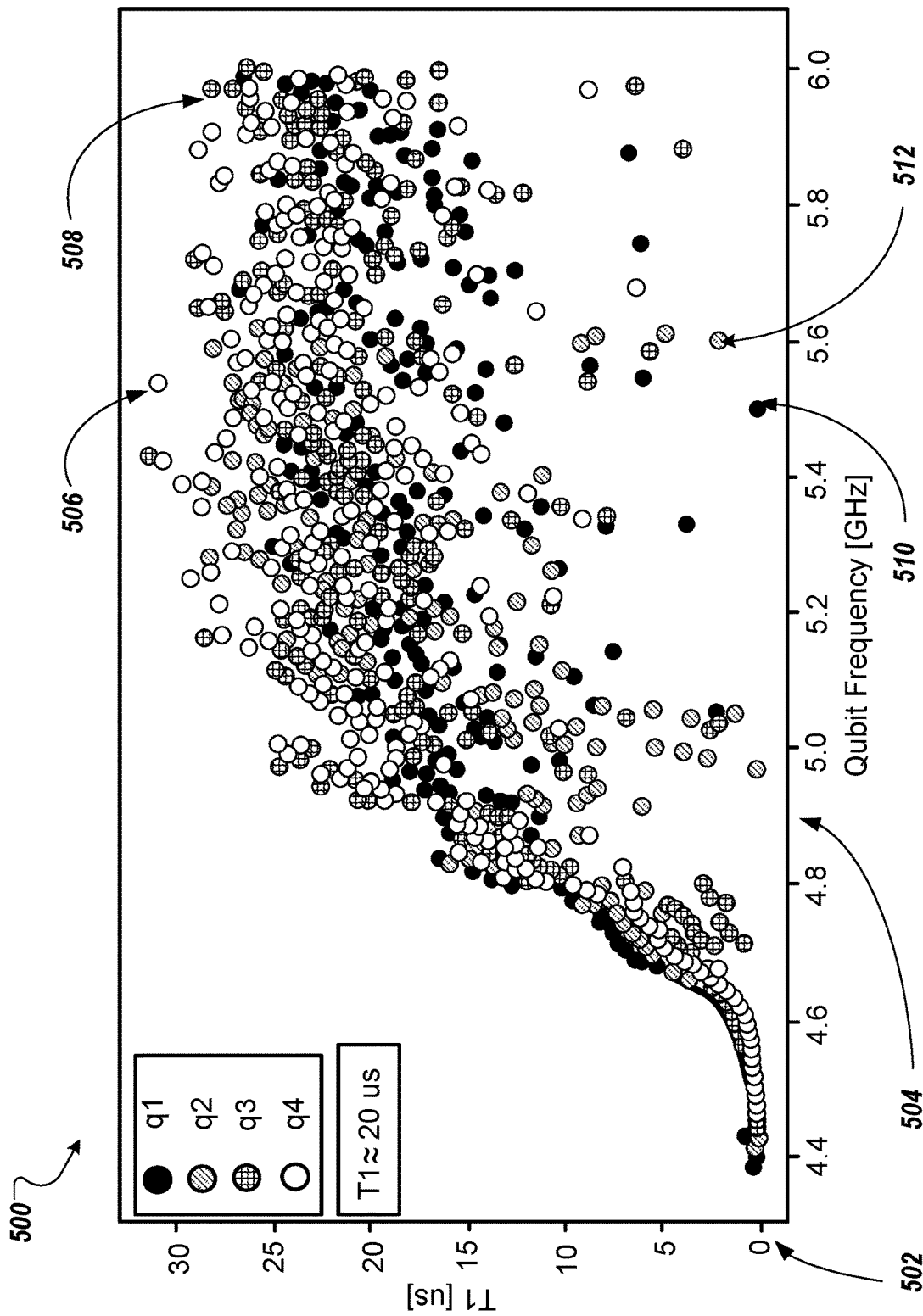
FIG. 5 shows simulation results for the relaxation time T1 of the four qubits of the example quantum computing chip design of FIGS. 4A-4B.

FIG. 5 shows simulation results 500 for the relaxation time T1 of the four qubits of the example quantum computing chip design of FIGS. 4A-4B.

The plot includes a horizontal axis 504 representing a qubit frequency in GHz and a vertical axis 502 representing the relaxation time T1 in microseconds. The results were obtained by cooling down the quantum computing chip shown with reference to FIGS. 4A-4B to an operating temperature, e.g. a temperature significantly lower than 1K, and repeatedly measuring each of the four qubits' 506, 508, 510, and 512 relaxation time for different qubit frequencies. For a qubit frequency above approximately 5.1 GHz each of the four qubits has a relaxation time of 20 microseconds or more in the majority of instances. In particular, the relaxation times T1 for the four qubits is not significantly different from the relaxation times of standard transmon qubits without a tunable qubit coupler (not shown). The results show that adding a tunable qubit coupler as described in the present disclosure does not significantly reduce the performance of the qubits, that is, adding such a tunable qubit coupler provides a dynamic and controllable range of qubit coupling, fast two-qubit gate execution, and an OFF state with zero coupling between the qubits without significantly reducing the qubits' quality factor.

Example Method for Implementing a Tunable Qubit Coupler

Figure 6:
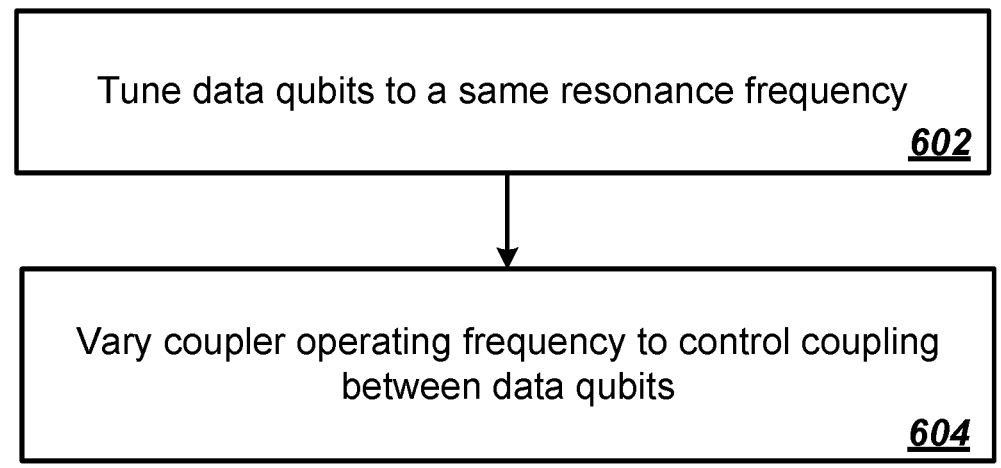
FIG. 6 is a flow diagram of an example process for controlling coupling between a first data qubit and a second data qubit using a tunable qubit coupler that is arranged to couple to the first data qubit and to couple to the second data qubit.

FIG. 6 is a flow diagram of an example process 600 for controlling coupling between a first data qubit and a second data qubit using a tunable qubit coupler that is arranged to couple to the first data qubit and to couple to the second data qubit. For example, the process 600 may be performed to control coupling between a first data qubit and a second data qubit through a tunable qubit coupler using the devices of FIGS. 2 and 4. For convenience, the process 600 will be described as being performed by quantum hardware in communication with control electronics located in one or more locations. For example, the device 400 of FIG. 4, appropriately programmed in accordance with this specification, can perform the process 600.

The first data qubit and the second data qubit are tuned to a same resonance frequency (step 602). The resonance frequency of the first data qubit and the second data qubit may be within a range of about 4 GHz to about 8 GHz. In addition, the resonance frequency of the first data qubit and the second data qubit may differ from an operating frequency of the tunable qubit coupler by about 0.5 GHz to 7 GHz.

The coupling between the first data qubit and the second data qubit is controlled by varying the operating frequency of the tunable qubit coupler (step 604). The tunable qubit coupler may include a superconducting quantum interference device (SQUID), and varying the operating frequency of the tunable qubit coupler may include varying a magnetic flux of the SQUID of the tunable qubit coupler. Varying the operating frequency of the tunable qubit coupler may include varying the operating frequency within a range of no less than about 4 GHz and no more than about 6 GHz.

After tuning each of the first data qubit and the second data qubit to the same resonance frequency at step 602, the operating frequency of the tunable qubit coupler may be varied to a first frequency to turn coupling off between the first data qubit and the second data qubit having the same resonance frequency. Varying the operating frequency of the tunable qubit coupler to turn coupling off may include varying the operating frequency so that a direct coupling between the first data qubit and the second data qubit is offset by an indirect coupling between the first data qubit and the second data qubit through the tunable qubit. The coupling between the first data qubit and the second data qubit that is a combination of the direct coupling between the first data qubit and the second data qubit, and the indirect coupling of the first data qubit and the second data qubit through the tunable qubit coupler may operate over a frequency range of about 45 MHz. In addition, the indirect coupling between the first data qubit and the second data qubit through the tunable qubit coupler may occur across a vacuum space under a vacuum pressure of less than at least $10^{-5}$ Torr.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The elements of a digital and/or quantum computer include a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

In certain cases, some or all of the quantum and/or classical circuit elements may be implemented using, e.g., superconducting quantum and/or classical circuit elements. Fabrication of the superconducting circuit elements can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin) and niobium (superconducting critical temperature of 9.3 kelvin). Accordingly, superconducting structures, such as superconducting traces and superconducting ground planes, are formed from material that exhibits superconducting properties at or below a superconducting critical temperature.

In certain implementations, control signals for the quantum circuit elements (e.g., qubits and qubit couplers) may be provided using classical circuit elements that are electrically and/or electromagnetically coupled to the quantum circuit elements. The control signals may be provided in digital and/or analog form.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A device comprising:
a first data qubit;
a second data qubit, wherein a first portion of the first data qubit is spaced apart from a first portion of the second data qubit by a gap;
a tunable qubit coupler arranged to couple to the first data qubit and to couple to the second data qubit such that, during operation of the device, the tunable qubit coupler allows tunable coupling between the first data qubit and the second data qubit, wherein the tunable qubit coupler comprises a single-ended transmon qubit;
a first substrate, wherein the first data qubit and the second data qubit are on a principal surface of the first substrate; and
a second substrate spaced apart from and coupled to the first substrate, wherein the tunable qubit coupler is on a principal surface of the second substrate and is arranged so as to overlap the first portion of the first data qubit, the first portion of the second data qubit, and the gap.

2. The device of claim 1, wherein the tunable qubit coupler is arranged on a first axis, wherein the first axis is:
orthogonal to a second axis that connects the first data qubit and the second data qubit; and
intersects the second axis between the first data qubit and the second data qubit.

3. The device of claim 1, wherein a pressure in a space between the first substrate and the second substrate is less than $10^{-5}$ Torr.

4. The device of claim 1, wherein the tunable qubit coupler comprises a superconducting quantum interference device (SQUID).

5. The device of claim 1, wherein the first data qubit and the second data qubit comprise a first differential qubit and a second differential qubit, respectively.

6. The device of claim 1, wherein the principal surface of the first substrate faces the principal surface of the second substrate.

7. The device of claim 1, wherein the first data qubit and the second data qubit are arranged on the principal surface of the first substrate such that, during operation of the device, the first data qubit and the second data qubit are directly coupled.

8. The device of claim 1, wherein the first data qubit is a single-ended transmon qubit.

9. The device of claim 8, wherein the second data qubit is a single-ended transmon qubit.

10. The device of claim 1, wherein the tunable qubit coupler comprises a superconductor island at least partially surrounded by a ground plane.

11. The device of claim 1, wherein the tunable qubit coupler comprises:
a tunable non-linear oscillator;
a capacitor; and
a superconducting quantum interference device (SQUID).

12. The device of claim 1, wherein the tunable qubit coupler comprises a shunt capacitor.

* * * * *